(12) United States Patent
Shero et al.

(10) Patent No.: US 12,249,534 B2
(45) Date of Patent: Mar. 11, 2025

(54) DETECTION METHOD FOR SEIZED TRAVELING LIFT PINS IN WAFER PROCESSING REACTOR SYSTEMS

(71) Applicant: ASM IP Holding B.V., Almere (NL)

(72) Inventors: Eric Shero, Phoenix, AZ (US); Abhishek Mangoli, Phoenix, AZ (US); Harihara Krishnan Krishnamoorthy, Tempe, AZ (US); Daniel Maurice, Phoenix, AZ (US); Julio Cesar Diaz, Gilbert, AZ (US); Massood Mostaghimi, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 249 days.

(21) Appl. No.: 17/887,646

(22) Filed: Aug. 15, 2022

(65) Prior Publication Data

US 2023/0054779 A1 Feb. 23, 2023

Related U.S. Application Data

(60) Provisional application No. 63/234,326, filed on Aug. 18, 2021.

(51) Int. Cl.
*H01L 21/687* (2006.01)
*H01L 21/66* (2006.01)
*H01L 21/67* (2006.01)

(52) U.S. Cl.
CPC .. *H01L 21/68742* (2013.01); *H01L 21/67259* (2013.01); *H01L 22/10* (2013.01)

(58) Field of Classification Search
CPC ......... H01L 21/68742; H01L 21/67259; H01L 22/10; H01L 21/67248; H01L 21/68785

USPC ........................................................ 361/234
See application file for complete search history.

(56) References Cited

U.S. PATENT DOCUMENTS

| | | | |
|---|---|---|---|
| 6,898,064 B1* | 5/2005 | Berman | H01L 21/6831 361/233 |
| 11,430,688 B2* | 8/2022 | Tian | H01L 21/67288 |
| 2002/0142492 A1* | 10/2002 | Fischer | G01N 29/12 118/668 |
| 2008/0148857 A1* | 6/2008 | Furukawahara | G01H 11/08 73/649 |
| 2012/0070996 A1* | 3/2012 | Hao | H01L 21/6831 438/758 |
| 2014/0202382 A1 | 7/2014 | Kim | |
| 2018/0223424 A1 | 8/2018 | Kim | |

(Continued)

*Primary Examiner* — Dharti H Patel
(74) *Attorney, Agent, or Firm* — Snell & Wilmer L.L.P.

(57) ABSTRACT

A reactor system with stuck lift pin detection. The system includes a reaction chamber, a susceptor for supporting wafers in an interior space of the reaction chamber, and an elevator for raising and lowering the susceptor in the interior space. Further, the system includes a lift pin supported by and extending vertically through the susceptor to travel between an up and a down position with movements of the susceptor by the elevator, and a landing pad is provided in the system for receiving a base of the lift pin when the lift pin is in the down position. Significantly, the system also includes a sensor assembly with a sensor positioned at least partially within the interior space of the reaction chamber. An output signal of the sensor is indicative of whether the lift pin is sticking or seizing during travel through the susceptor.

20 Claims, 12 Drawing Sheets

(56) References Cited

U.S. PATENT DOCUMENTS

2020/0075389 A1* 3/2020 Tian .................. H01L 21/67259
2023/0030464 A1* 2/2023 Bak ................... H01L 21/68742

* cited by examiner

DETECTION METHOD FOR SEIZED TRAVELING LIFT PINS IN WAFER PROCESSING REACTOR SYSTEMS

CROSS-REFERENCE TO RELATED APPLICATIONS

This application is a nonprovisional of, and claims priority to and the benefit of, U.S. Provisional Patent Application No. 63/234,326, filed Aug. 18, 2021 and entitled "DETECTION METHOD FOR SEIZED TRAVELING LIFT PINS IN WAFER PROCESSING REACTOR SYSTEMS," which is hereby incorporated by reference herein.

FIELD OF THE DISCLOSURE

The present disclosure relates generally to methods and systems utilizing lift pins to lift wafers from susceptors in a wafer processing or reactor system, and, more particularly, to methods and apparatus for detecting seized or stuck lift pins in a semiconductor processing or reactor system.

BACKGROUND OF THE DISCLOSURE

Semiconductor processing techniques, including atomic layer deposition (ALD) and chemical vapor deposition (CVD), are often used for forming thin films of materials on substrates, such as silicon wafers. To carry out such processing, reactor systems or tools are used that have a reaction chamber in which a susceptor or substrate holder is positioned and used for holding wafers during wafer processing steps.

In some reaction system designs, including a number of ALD reactor system or apparatus, the susceptor is capped, and lift pins that extend upward through the susceptor and its cap are used to facilitate unloading of wafers by extending a distance above the upper surface of the cap when a susceptor elevator is lowered or in a down position to lift the wafer off the susceptor. The lift pins are considered to be in the "up" position at this stage of operations of the reactor system. When the elevator is raised to an up position to lift or raise the susceptor and its cap, the lift pins are configured to travel downward relative to the susceptor so that the top or heads of the lift pins are flush or below the upper surface of the cap.

Due to several factors, though, the wafer lift pins in reactor systems or apparatus can become stuck in the up position. In this undesirable operation condition, the head of the lift pin protrudes above the susceptor pocket position when it should be fully retracted below the surface. The result can be that a received or dropped wafer does not sit flat on the cap or in the cap (or susceptor) pocket, which can negatively impact wafer processing and lead to scrapped production wafers. For example, a tilted wafer caused by a stuck lift pin(s) can cause non-uniform deposition due to a non-uniform or undesired wafer temperature profile and dead volume created by the tilted wafer.

Often, the problem of seizing or sticking lift pins can go undetected until a daily monitor is run and many wafers are impacted. Existing design approaches have not been widely effective or adopted. One approach to monitoring lift pin travel is to use a series of lasers through lower reaction chamber view ports to attempt to see if the bottom of the pin is at the proper height, which can indicate that the pin is properly recessed. This is an expensive solution and occupies view ports that are more preferably used for visual inspection and maintenance access. Also, view ports or windows can become fogged by leaking precursors, e.g., from upper reaction chamber to the lower wafer transfer chamber, and this will obscure proper viewing. Another proposed design involves having electric current pass or not pass through the contacting pin bottom and pin pad, but, in reaction chambers, film (e.g., of a dielectric or the like) buildup on the pad or pin may occur that would change resistance over time and decrease the accuracy of the pin monitoring approach.

Hence, there is a demand for a methodology to accurately and cost effectively detect the occurrence of a stuck lift pin(s) to alert the user of a reactor system or one of its chambers to stop production until the issue can be identified and resolved.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

More specifically, the present description provides a reactor system with stuck lift pin detection. The system includes a reaction chamber, a susceptor for supporting wafers in an interior space of the reaction chamber, and an elevator for raising and lowering the susceptor in the interior space. Further, the system includes a lift pin supported by and extending vertically through the susceptor to travel between an up and a down position with movements of the susceptor by the elevator, and a landing pad is provided in the system for receiving a base of the lift pin when the lift pin is in the down position. Significantly, the system also includes a sensor assembly with a sensor positioned at least partially within the interior space of the reaction chamber. An output signal of the sensor is indicative of whether the lift pin is sticking or seizing during travel through the susceptor.

In some useful embodiments, the sensor assembly further includes a detection module displaying data based on the output signal of the sensor or processing the output signal of the sensor to detect when the lift pin is sticking or seizing during the travel through the susceptor. In such embodiments, the output signal provides a sensed temperature or pressure and wherein the processing of the output signal by the detection module includes comparing the sensed temperature or pressure with predefined temperature or pressure disturbances associated with travel of the lift pin free of sticking or seizing or includes comparing timing of the sensed temperature or pressure with reference to movements of the elevator.

In these or other implementations, the system may also include a cap covering an upper surface of the susceptor, and the sensor may include a temperature sensor positioned within a passageway provided in a body of the cap, whereby the output signal is associated with a sensed temperature of the cap. In such cases, the temperature sensor may include a thermocouple or a resistance temperature detector positioned proximate to a center axis of the cap. Additionally, the temperature sensor may include a line for carrying the output signal extending away from the thermocouple or the resistance temperature detector, and the line may include two or more coils in the interior space of the reaction chamber. In the same or other cases, the temperature sensor may include a thermocouple or a resistance temperature detector positioned a radial distance from an edge of the cap that is in the range of 40 to 60 millimeters.

In other embodiments of the system, the sensor may include a temperature sensor positioned within the landing pad, whereby the output signal is associated with a sensed temperature of the landing pad. In such embodiments, the temperature sensor may include a thermocouple or a resistance temperature detector positioned in a head of the landing pad adapted for receiving the base of the lift pin.

In other exemplary embodiments, the sensor includes a gas inlet in the landing pad, a pressure sensor disposed exterior to the reaction chamber, and a flow line fluidically coupling the landing pad to the pressure sensor, whereby the output signal is associated with a sensed pressure in the flow line. In such embodiments, the gas inlet may include a hole in a head of the landing pad. Then, the base of the lift pin covers or obstructs flow of gas through the hole when the lift pin is in the down position, and the sensor assembly may further include a gas pump coupled to the flow line operable to draw gas from the interior space of the reaction chamber through the landing pad and the flow line.

According to some aspects of the description, a method is provided for monitoring lift pin travel in a reaction chamber. The method includes, with a temperature sensor, sensing a temperature of a susceptor cap at an operational state of the reaction chamber. The method also includes comparing the temperature of the susceptor cap with a predefined range of expected temperatures for the operational state of the reaction chamber. Then, the method involves, when the comparing determines the temperature of the susceptor cap is outside the predefined range of expected temperatures, generating an alert message or updating a graphical user interface (GUI) indicating a stuck lift pin condition.

In some embodiments of this method, the operational state of the reaction chamber is associated with dropping a wafer upon an upper surface of the susceptor cap. In these or other implementations of the method, the temperature sensor includes a thermocouple or a resistance temperature detector positioned within the susceptor cap.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Figure 1:
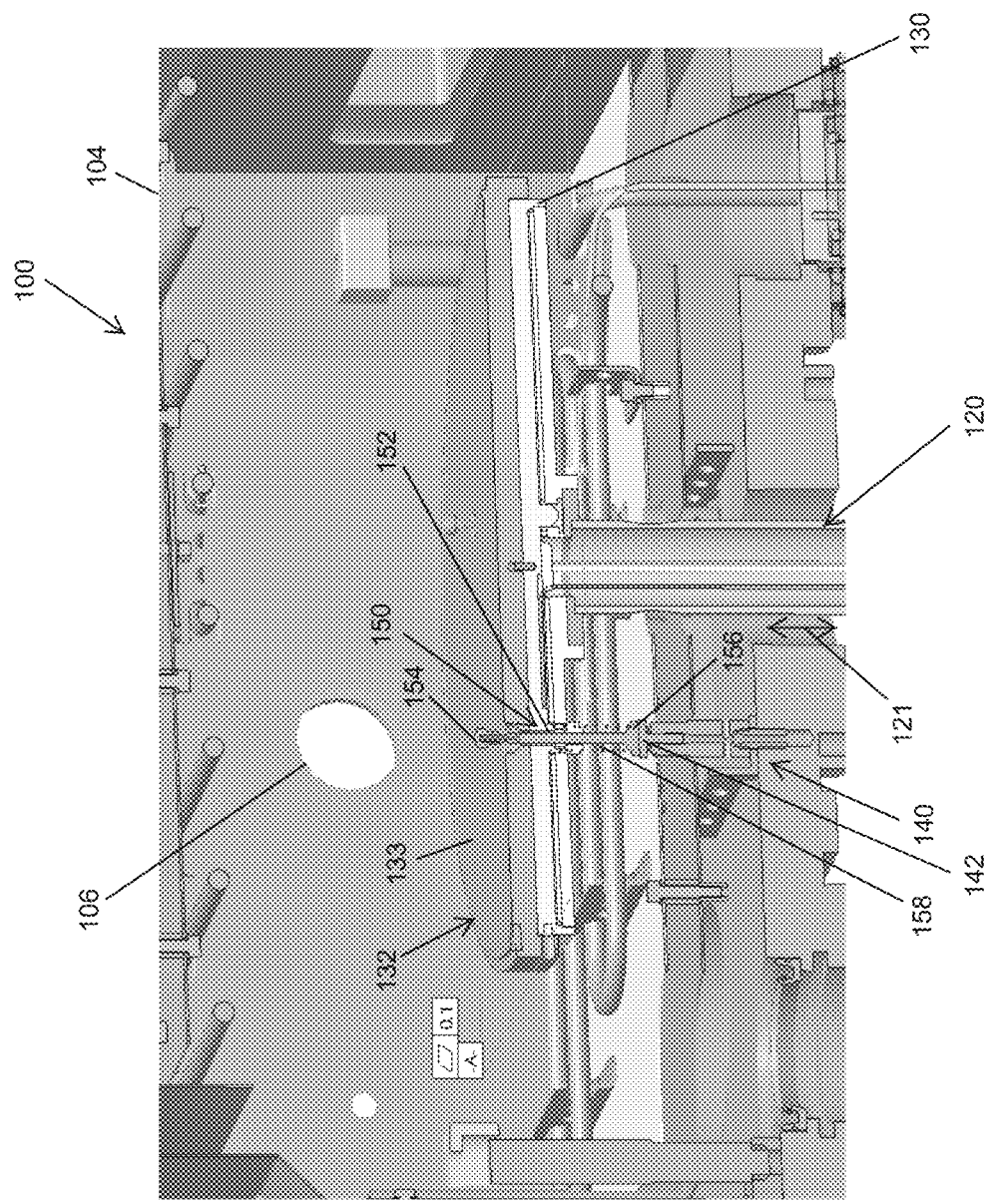
FIG. 1 is a simplified cross-sectional view of a portion of a reaction chamber with a conventional layout with a susceptor with a cap adapted for supporting a wafer during deposition processes and showing a convention lift pin and landing pad assembly.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As described in greater detail below, various details and embodiments of the disclosure may be utilized in conjunction with a reactor system with one or more reaction chambers configured for a multitude of deposition processes, including but not limited to, ALD, CVD, metalorganic chemical vapor deposition (MOCVD), molecular beam epitaxy (MBE), physical vapor deposition (PVD), plasma-enhanced chemical vapor deposition (PECVD), and plasma etching. The embodiments of the disclosure may also be utilized in semiconductor processing systems configured for processing a substrate with a reactive precursor, which may also include etch processes, such as, for example, reactive ion etching (RIE), capacitively coupled plasma etching (CCP), and electron cyclotron resonance etching (ECR).

The inventors recognized the importance of sensing or detecting when a lift pin seizes or sticks preventing or delaying its travel from an up to a down position. To address this problem, reactors systems are described herein that are configured to provide relatively simple and cost effective ways to detect the occurrence of a stuck pin or pins and, in response, to alert an operator of a reactor system to address the issue. In brief, a reactor system design is taught that includes a sensor assembly that is adapted to sense or detect when a lift pin is sticking or seizing so that it remains temporarily or permanently in the up position (with its top portion or head above an upper surface of the susceptor or a susceptor cap). A detection module or routine run by a processor(s) of the sensor assembly processes sensor signals (or sensor data) to determine when a pin has stuck or seized (e.g., by identifying a temperature or pressure disturbance from normal operating parameters, by identifying when a lift pin does not mate with the pin pad, or the like) and, in some cases, responds by generating a stuck pin alert that is communicated (e.g., via a graphical user interface (GUI), via a text message, or the like) to an operator of the reactor system for action.

The sensor assembly may use a variety of sensors to sense a stuck lift pin in a reactor system. In one embodiment, the sensor is provided on the pin landing pad to sense a stuck lift pin, e.g., by detecting absence of a pin during operations when it should be received on the pad. The sensor, in this case, may take the form of capacitive sensor (e.g., one suited for a particular chamber environment such as 300 C or the like at vacuum and with a small form factor for mounting on the pin landing pad) provided on each pin landing pad. In other embodiments (illustrated in detail in the figures), the sensor assembly is configured for thermal monitoring or for pressure monitoring to detect a stuck lift pin.

An advantage of each of these techniques is they are durable and inexpensive with respect to the chamber environment. For thermal-based sensing, thermocouples are already known to be useful in the low pressure and hot environments associated with semiconductor processing. For pressure-based sensing, a small leak can be used to allow pressure detection outside the lower chamber in ambient, non-harsh environments with relatively inexpensive, durable, and low footprint components that do not impact service of the reactor system.

The thermal monitoring may involve monitoring temperatures of the landing pin or of the susceptor cap. In the landing pin embodiments, thermal monitoring is performed for each of the pin landing pads, with the detection module or algorithm operating to look for a change in temperature associated with a hot pin touching a cooler landing pad (i.e., expected temperature changes). In this implementation, a temperature sensor (e.g., a thermocouple or resistance temperature detector (RTD)) is brought into contact with the underside of the pin pad surface (e.g., where the pin rests when elevators are in down or lowered position to expose the pin for wafer handoff) from behind.

The thermal monitoring embodiment uses the concept that when the pin is on the pad the temperature sensor will be at one temperature and when the pin is off the pad the temperature sensor and pad will be at a different or second temperature. The detection module/software may use an algorithm that looks for an absolute temperature or a rapid temperature change during elevator movement so as to compare current reactor system behavior with a predefined or known set of "good" or expected behavior when the lift pins are not sticking. If a change in temperature does not occur at all or occurs at a different time relative to the other lift pins, an alert or warning can be issued for production to stop and visual troubleshooting to commence. Deposition on either the pin or pad should not substantially change behavior from this known temperature baseline. Similar monitoring algorithms can be used when the temperature sensor is placed in the susceptor or its cap.

The pressure or vacuum sensing embodiments include a sensor assembly configured to monitor pressure or pressured changes to determine when or if a lift pin comes down to touch a corresponding landing pad, which changes the gas conduction of the hole in the pad by adding resistance or blocking the hole. In some implementations, a hole is drilled through the pin pad assembly to allow a small gas flow from the lower chamber (e.g., inert gas such as nitrogen) to the process foreline or other dedicated exhaust when the pin is in the up position. When the pin and its base contact the pad, the hole is blocked or at least partially obscured and the pressure below the weep hole in the pad will drop and approach that of the exhaust. A pressured transducer can be used to identify when or if this occurs. Alternatively, a pressure switch may be used to detect flow or no-to-low flow conditions in the pad assembly and trigger a digital output/signal for each pin. The detection module may then be used to trigger a warning or alert based on, for example, a comparison of the pins to each other or to a known or predefined acceptable or expected ("good") pressure baseline during elevator movements or operations.

FIG. 1 is a simplified cross-sectional view of a portion of a reaction chamber 100 that may be provided in a reactor system. The chamber 100 has a sidewall 104 in which a viewport 106 is provided for visually inspecting the interior space of the chamber 100. The chamber 100 has a conventional layout with an elevator 120 that can move up and down between up and down positions (or load and unload wafer positions) as shown with arrow 121. The elevator 120 supports and moves a susceptor 130 with a cap 132 adapted with an upper surface 133 for supporting a wafer (not shown) during deposition processes in the chamber 100, with the elevator 120 and susceptor 130 shown in the down position in FIG. 1.

To facilitate loading and unloading of wafers, a landing pad assembly 140 is shown that includes a stationary landing pad 142. Further, a number lift pins are provided, with one landing pad assembly 140 per lift pin (e.g., three lift pins paired each paired with a landing pad assembly 140). As shown, a lift pin 150 is provided that is paired with landing pad assembly 140. The lift pin 150 includes an elongated body or shaft 152 that extends through a passageway in the susceptor 130 and cap 132, and a head 154 is provided at a top end or portion of the body 152. The head 154 extends above the upper surface 133 of the cap 132 when the susceptor 130 is in the down position due to movement 121 of the elevator.

To this end, the lift pin 150 includes a base 156 at a bottom end or portion of the body 152 that mates with the landing pad 142 to halt or limit downward travel of the pin 150 with elevator 120. A spring 158 extends over an exterior surface of the body 152 and contacts a lower portion of the susceptor 130 (or another component attached to the susceptor 130), and the spring 158 is compressed when the elevator 120 is moved 121 into the down position and is released to move to its at-rest configuration when the elevator 120 moves 121 to the up or raised position. This causes the pin 150 to be lowered with the head 154 flush or below the surface 133 of the cap 132, when deposition or other processes may occur in chamber 100. When a pin 150 sticks or seizes, however, the spring force may not be adequate cause the pin 150 to properly move downward or such movement may be delayed.

Figure 2:
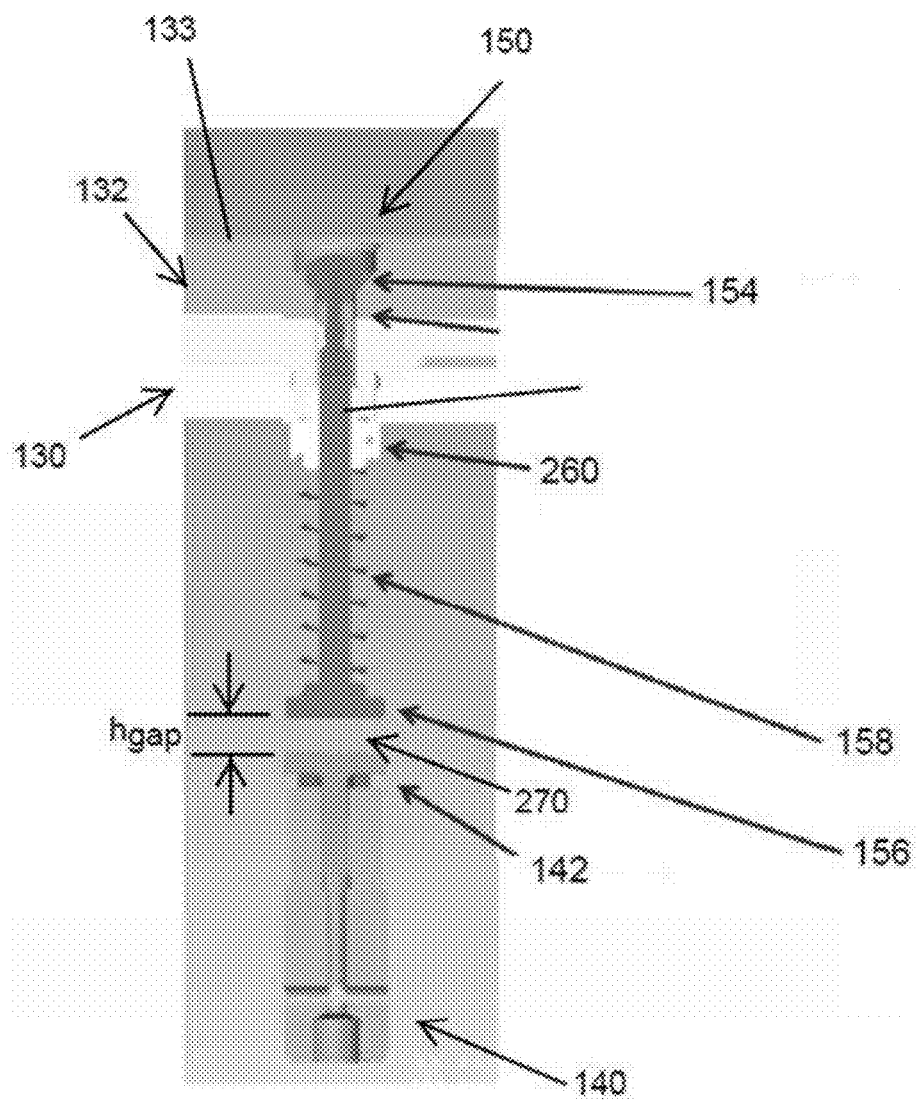
FIG. 2 is an enlarged view of a portion of the reaction chamber of FIG. 1 showing the lift pin and landing pad assembly in greater detail.

FIG. 2 is an enlarged view of a portion of the reaction chamber 100 of FIG. 1 showing the lift pin 150 and landing pad assembly 140 in greater detail. As shown, a pin guide/bushing 260 is provided that is mated with a lower surface of the susceptor 130 that acts to guide the vertical travel of the body 152 of the lift pin 150. The pin guide/bushing 260 also acts as a mating surface for the upper end of the spring 158 to limit its upward travel and assist in its compression with downward movement of the elevator and susceptor 130. In FIG. 2, the susceptor 130 is in the up or raised position, and the spring 158 has been released to its at-rest (or nearly so) position to move the pin body 152 downward relative to the susceptor 130 and cap 132 such that the head 154 of the lift pin 150 is recessed from or flush with the upper surface 133 of the cap 132, as desirable for wafer placement/support on the cap 132 during processing. A gap 270 with a height, $h_{gap}$, (e.g., 15 to 35 millimeters or more) is created between the landing pad 142 and the base 156 of the lift pin 150.

As can be seen from FIGS. 1 and 2, chamber and lift pin designs conventionally were selected such that the susceptor 130 moves down for wafer load, which pushes pins 150 upward as bottom or base 156 of the pin 150 contacts the landing pad 142 (which may be mounted to a bottom plate of the chamber 100). Susceptor 130 is moved up with movement 121 of the elevator 120 inside the chamber 100 for processing of a wafer received on the surface 133 of the cap 132. Lift pins 150 travel up with the susceptor 130, and no longer contact the landing pad 142. Springs 158 force the pin head 154 to retract into the susceptor 130 or its cap 132. With a wafer in place, it can be difficult to track the pin head 154 location inside the chamber 100 from the available side viewports such as viewport 106 in sidewall 104 of the chamber 100.

Figure 3:
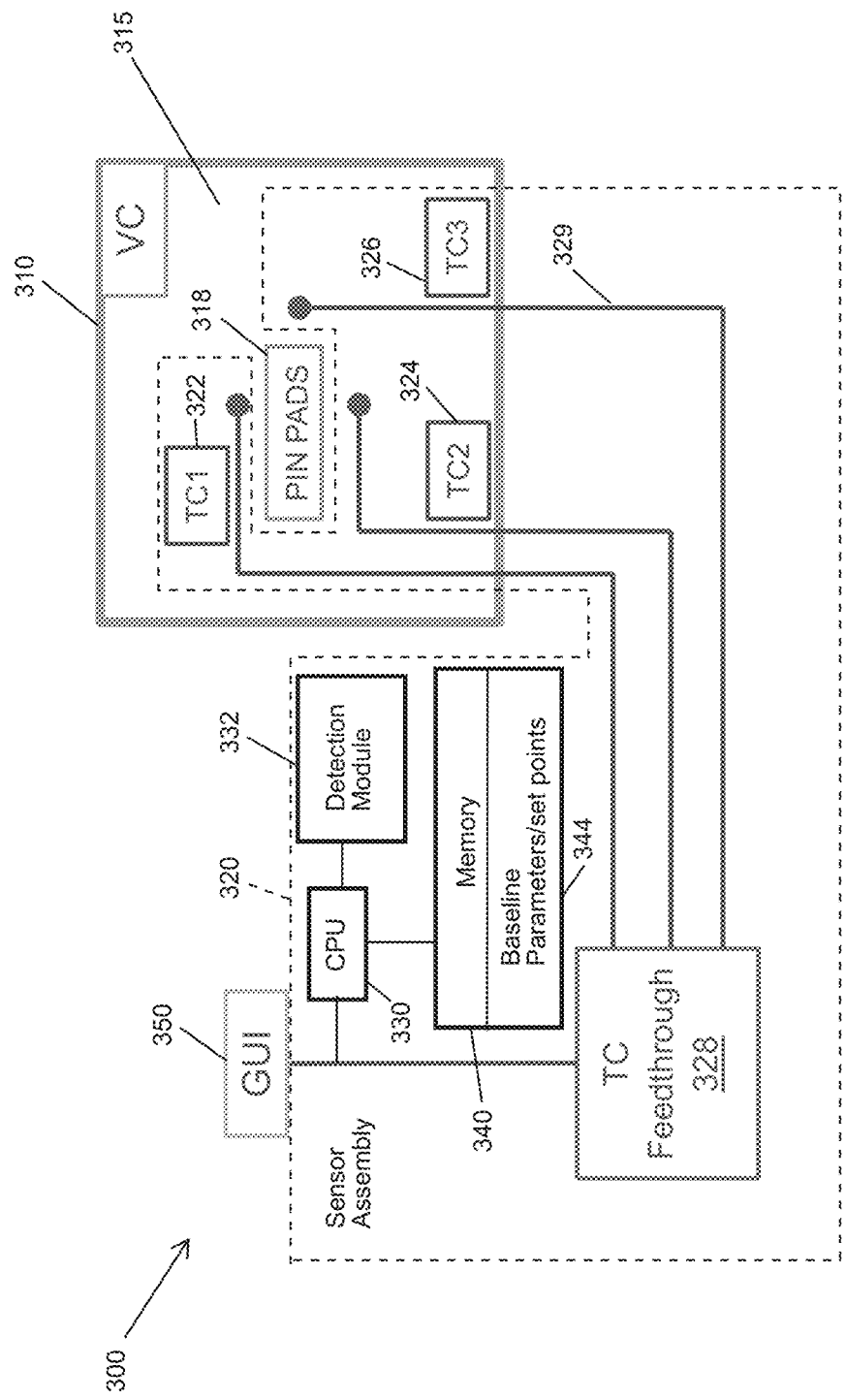
FIG. 3 illustrates a schematic diagram of a portion of a reactor system configured according to the present description to utilize temperature sensors positioned in the landing pads to detect stuck lift pins.

Now, turning first to the thermal monitoring approach to detecting stuck lift pins, FIG. 3 illustrates a schematic diagram of a portion of a reactor system 300 configured according to the present description to utilize temperature sensors positioned in the landing pads to detect stuck or seized lift pins. The inventors recognized that lift pins will have a higher temperature when they are in the process position (with the elevator and susceptor in the raised or up position) compared to landing pads, which will be at steady state lower temperature(s). With this in mind, a temperature sensor could be mounted in-situ on each pin landing pad to monitor temperature variations when pins rest on pads to detect when a pin is stuck, e.g., the temperature of one the pads does not increase as expected or in a similar manner to the other pads.

Figure 4:
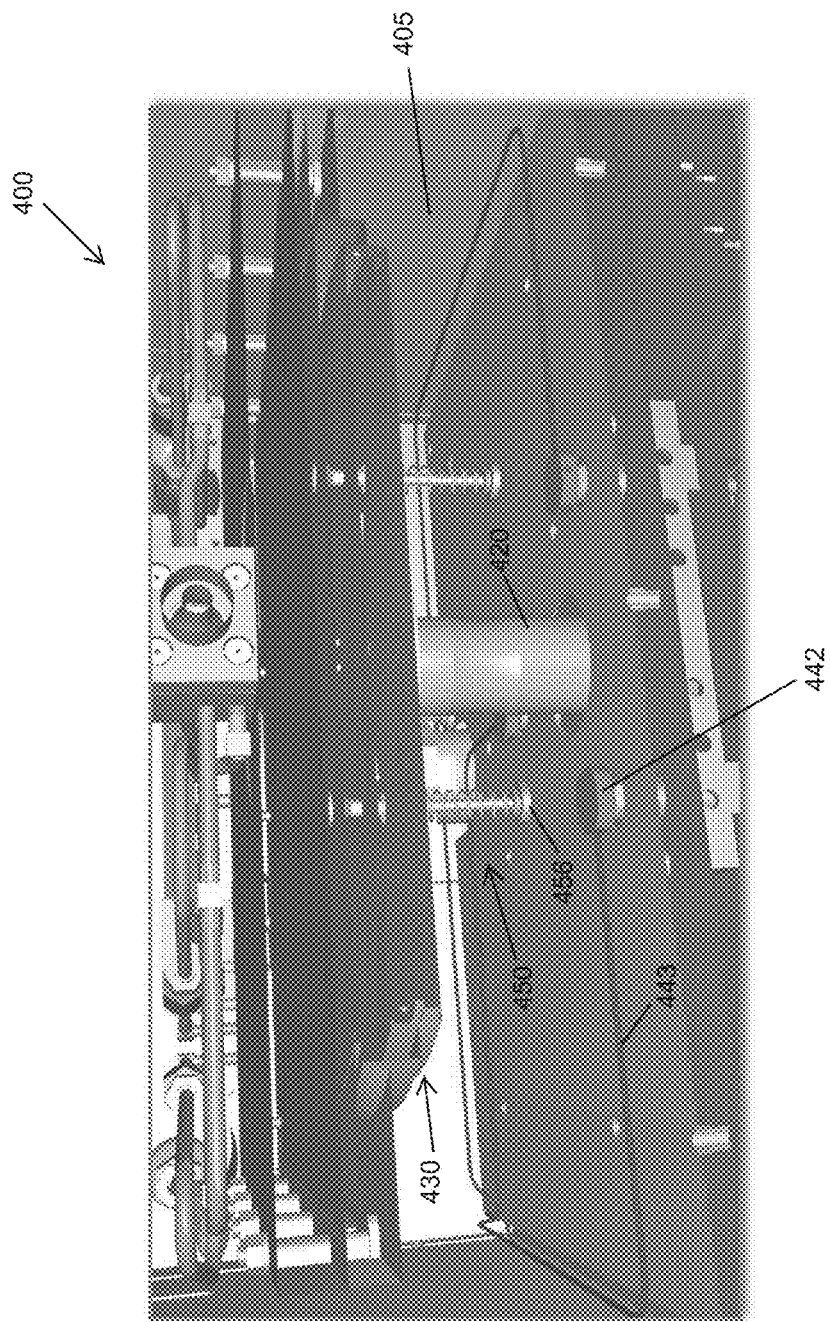
FIG. 4 is a simplified cross-sectional view of a portion of a reaction chamber, similar to FIG. 1, that has been adapted to provide thermal monitoring using temperature sensors in pin or landing pads in the chamber.

As shown in FIG. 3, the reactor system 300 includes a reaction or vacuum chamber 310 with an interior space 315 in which wafers may be processed. The chamber 310 may generally be configured similar to the chamber 100 of FIG. 1, with landing or pin pads 318 provided to mate with a like number of lift pins supported upon a susceptor (as shown in FIG. 4 and understood from FIGS. 1 and 2). A sensor assembly 320 is included in the reactor system 300 and is adapted for detecting when one of the lift pins sticks through thermal monitoring within the interior space 315 of the chamber 310.

The sensor assembly 320 includes temperature sensors 322, 324, and 326 (shown as thermocouples but may take other forms such as RTDs or the like) in the space 315. More particularly, a thermocouple 322, 324, 326 is mounted into each of the pin or landing pads 318 in the space 315 (with three being shown in this non-limiting example). Communication lines 329 extend outward from each thermocouple 322, 324, 326 out of the chamber 310 through a TC feedthrough 328.

The sensor assembly 320 includes a processor(s) 330 that executes software, code, or instructions (that may be in memory 340) to provide the functions of a detection module 332, which include processing signals from the thermocouples 322, 324, 326. Further, the sensor assembly 320 includes memory or data storage 340 that is managed by the processor 330 to facilitate operations of the detection module 332. To this end, the memory 340 may store a set of predefined baseline parameters or setpoints 344 for the operations of the system 300. These may include expected temperatures and/or temperature increases for the pads 318 when lift pins are resting upon or contacting the pads 318. The parameters 344 may also include timing of elevator movements to allow the detection module 332 to match elevator movements (and corresponding susceptor positions) with measured temperatures of the pads 318.

For example, the module 332 may determine that an expected temperature disturbance (a rise in pad temperature) is not seen or is delayed for one (or more) of the pads 318 and, in response, may generate an alert or warning of a potentially stuck pin. This alert may be communicated to an operator or use of system 300 such as via a graphical user interface (GUI) 350 on a monitor/display device. In some cases, the outputs (sensed pad temperatures) from the thermocouples 322, 324, and 326 are displayed on the GUI 350 to provide real-time (or near real-time) monitoring of pad temperatures and/or temperature variations between the pads 318 (e.g., when pins are expected via elevator movements to be resting on the pads 318). For example, testing has indicated there may be delay of temperature disturbance (rising) of 3 to 4 seconds in the case of a pin that is experiencing sticking, and this delay in temperature disturbance may be used by the detection module as an indicator of a stuck pin (e.g., a delay of greater than "X" produces an alert or a delay in the range of "Y to Z" produces such an alert).

FIG. 4 illustrates a simplified cross-sectional view of a portion of a reaction chamber 400 in which the thermal monitoring provided by system 300 may be implemented. As shown, the chamber 400 includes in interior space 405 in which an elevator 420 is provided to support and selectively raise and lower a susceptor 430. A number (e.g., three) of lift pins are supported by the susceptor 430 and move with it during operations of the elevator 420. The susceptor 430 is shown to be in the up or raised position. In this operation state of the chamber 400, a lift pin 450 is raised, too, such that its bottom portion or base 456 is spaced apart from a corresponding pin or landing pad 442.

The landing pad 442 (as well as other pads in the chamber 400) has been modified to include a temperature sensor (not visible in FIG. 4 but shown in FIGS. 3, 5, and 6) such as a thermocouple or RTD, and a communication or connection wire/line 443 is shown to communicatively link the temperature sensor in the landing pad 442 with other components (e.g., a processor 330 and/or TC feedthrough) of a sensor assembly (e.g., assembly 320 of FIG. 3) to provide its output data/signals (e.g., sensed temperatures of pad 442) for display and/or further processing.

Figure 5:
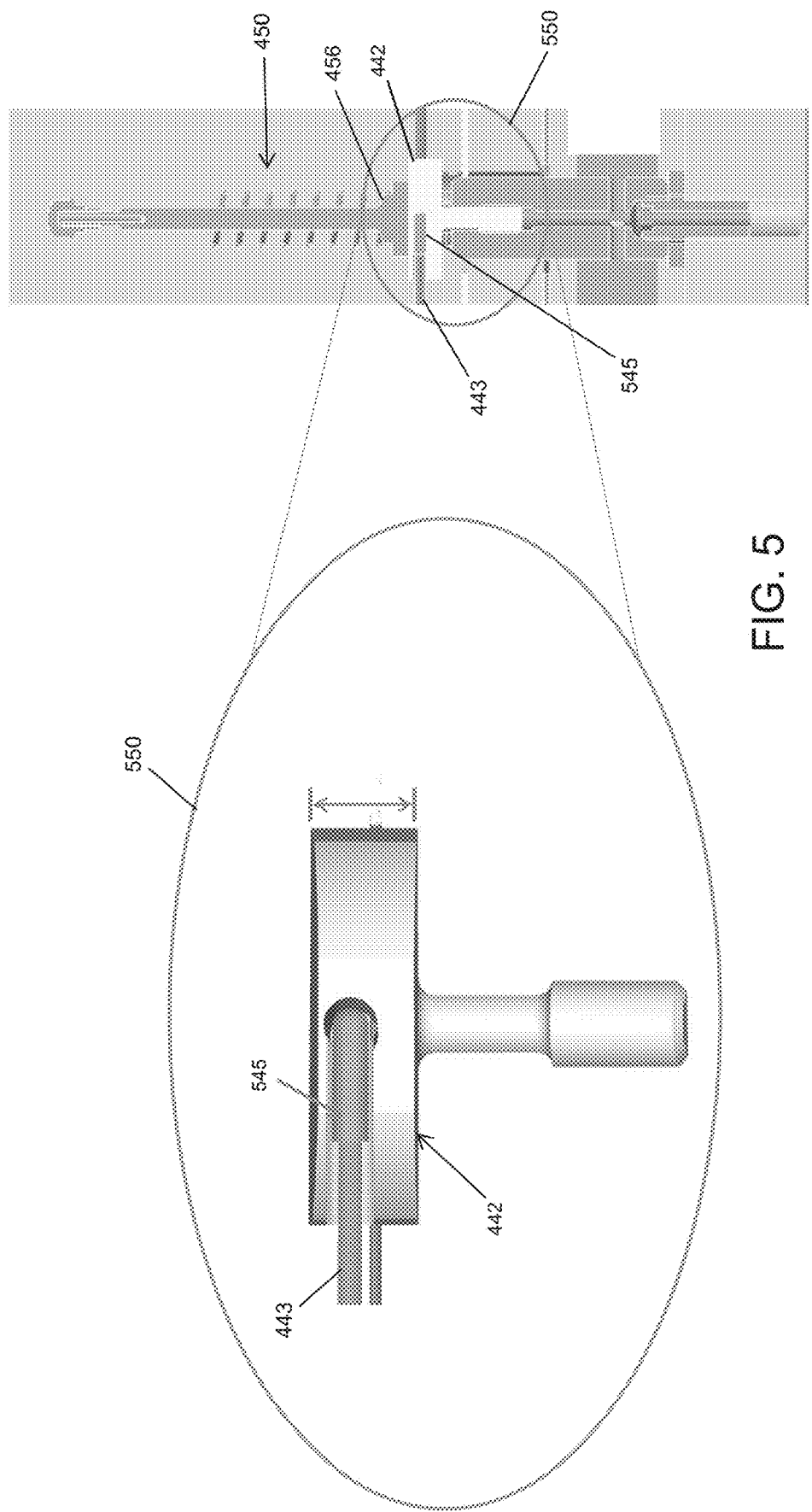
FIG. 5 is an enlarged partial view of the reaction chamber of FIG. 4 showing, with a sectional view, more details of a pin or landing pad design supporting thermal monitoring.

FIG. 5 is an enlarged partial view of the reaction chamber of FIG. 4 showing, with a sectional view, more details of a pin or landing pad design supporting thermal monitoring to detect stuck lift pins, and view 550 is a further enlargement showing modification of the landing pad 442 in more detail. As shown, the lift pin 450 is in a down or pin-rest position (e.g., in response to lowering of the susceptor by the elevator), with its base 456 resting on or in abutting contact with the upper surface of the pin or landing pad 442. In this position, heat from the pin 450 is transferred via conduction to the pad 442 causing its temperature to rise.

The pin pad 442 is modified, when compared to a conventional pad, to have an increased thickness (or head thickness), $t_{pad}$, to allow the thermocouple 545 to be mounted within the pad 442. For example, the thickness may be increased by 2 to 4 mm or more to allow a thermocouple 545 to be received within a recessed portion or passageway in the pad 442. This places the thermocouple 545 in contact with the material of the pad 442 and near its upper surface that abuts/receives the base 456 of the pin 450 (e.g., as close as practical such as within 0.5 to 2 mm or the like) to facilitate temperature monitoring. Typically, as shown, the thermocouple 545 is positioned at or proximate to the center of the pad 442 for more accurate readings.

In some applications of the thermal monitoring concept, it may be desirable to monitor other components in the reaction chamber to detect seized or stuck pins. In one useful example, the inventors determined that it may be desirable to monitor the temperature of the susceptor cap instead of pin or landing pads to detect, based on temperature variances, the presence of a stuck or seized lift pin.

During wafer processing, there is an expected temperature disturbance or change for a susceptor cap when a cold wafer is dropped or placed on the upper surface of the susceptor (i.e., when the susceptor is raised by the elevator causing the heads of the lift pins under spring forces to become recessed or flush with the cap surface when operating normally or without sticking). This baseline range or parameter (e.g., a temperature drop of 2 to 8° C. or the like with some testing showing 2.5 to 3° C. in some chamber designs while others see 5 to 6° C. drops) can be used to detect stuck pins as the temperature drop is not seen or experienced with a delay. A temperature sensor, such as a thermocouple, may be provided in the susceptor cap to monitor its temperature.

The system 300 of FIG. 3 would be modified to implement this alternative embodiment with the three thermocouples 322, 324, 326 being replaced (typically) with a single thermocouple that is mounted within the susceptor cap instead of within landing pads (or the heads of such pads). The baseline parameters 344 would be modified to provided expected temperature variances for the susceptor cap and/or timing of such variances with respect to elevator movements, and the detection module 322 would process temperatures sensed for the susceptor cap to identify potential stuck or seized pin conditions (e.g., a smaller temperature drop (e.g., 2 to 3° C. difference in the sensed temperature drop) or a delayed temperature disturbance), with alerts/warnings or monitored data communicated to users such as via GUI 350.

Figure 6:
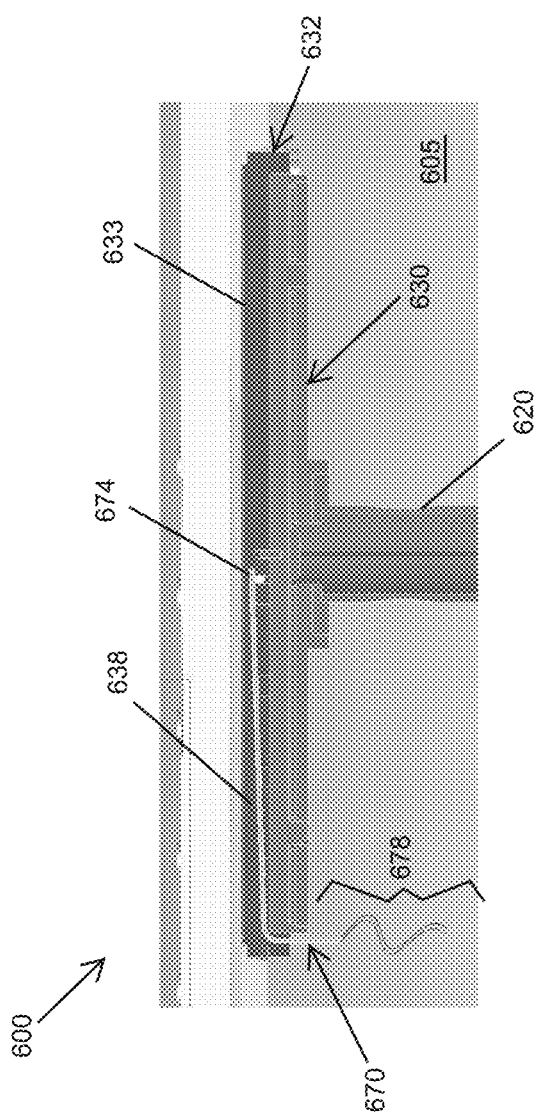
FIG. 6 is a side sectional view of a portion of a reaction chamber with a susceptor cap adapted for thermal monitoring according to another embodiment of the present description.
Figure 7:
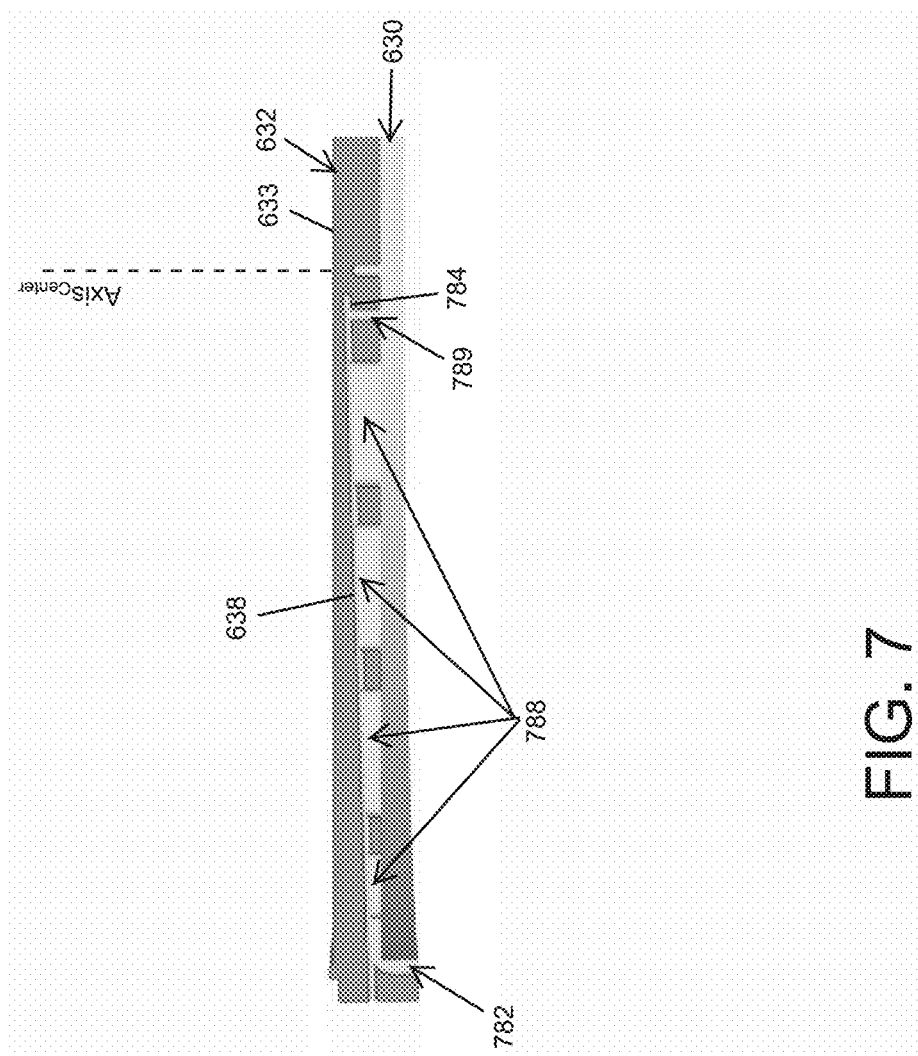
FIG. 7 is an enlarged view of a portion of the susceptor cap of FIG. 6 prior to insertion of a thermocouple illustrating additional features of the modified cap.

FIG. 6 is a side sectional view of a portion of a reaction chamber 600 with a susceptor cap 632 adapted for thermal monitoring according to another embodiment of the present description. FIG. 7 is an enlarged view of a portion of the susceptor cap 630 of FIG. 6 prior to insertion of a thermocouple 670 (or other temperature sensor) illustrating additional features of the modified cap. As shown, the chamber 600 includes an interior space 605 in which an elevator 620 is provided that supports and raises and lowers a susceptor 630. The cap 632 is positioned over the susceptor 630 to move with it and with an upper surface 633 facing upward in the space 605. During wafer processing operations, cold wafers are dropped upon the surface prior to deposition and other processes, and the susceptor cap 632 is configured to provide thermal monitoring useful for detecting stuck lift pins (not shown but understood from FIGS. 1-5).

The sensor assembly in this case would include the temperature sensor 670 that may take the form of a thermocouple (e.g., a stainless steel (SS)-sheathed TC). Its head or sensor element 674 is positioned at the end of a passageway 638 (e.g., a drilled hole) in the body of the susceptor cap 632 such that is located at or near the center axis, $Axis_{Center}$, of the cap 632. As shown in FIG. 7, the passageway 638 extends from an inlet 782 to an internally-located end wall 784, against which a sensor element (or TC) 674 would be positioned upon assembly. The sensor element or end (or TC or RTD) may be positioned at a sensing location as near to the surface 633 of the cap 632 as practical (such as 0.5 to 2 mm from the surface 633 of the cap) to provide more accurate temperature sensing.

To facilitate maintenance and installation of the temperature sensor 670, a number of slots/windows 788 (e.g., machined slots or the like) are provided on the bottom surface of the susceptor cap 632 to provide access to the passageway 638 to allow an assembler to push or guide the temperature sensor 670 along the passageway 638. A threaded hole 789 is provided in the lower surface of the cap 632 to allow a set screw to be inserted and secure the sensor 670 in place in the passageway 638. Since the elevator 620 will go up and down repeatedly (e.g., 40 mm of vertical travel may be expected in some cases), a conventional thermocouple may be damaged by stretching and fatigue. Hence, the sensor cord 678 is shown to be configured with a pig tail arrangement with two, three, or more coils to provide a spring-like action that provides relief and accommodates the movement of the elevator 620 and cap 632 on susceptor 630 and avoids wear or damage of the sensor 670.

Figure 8:
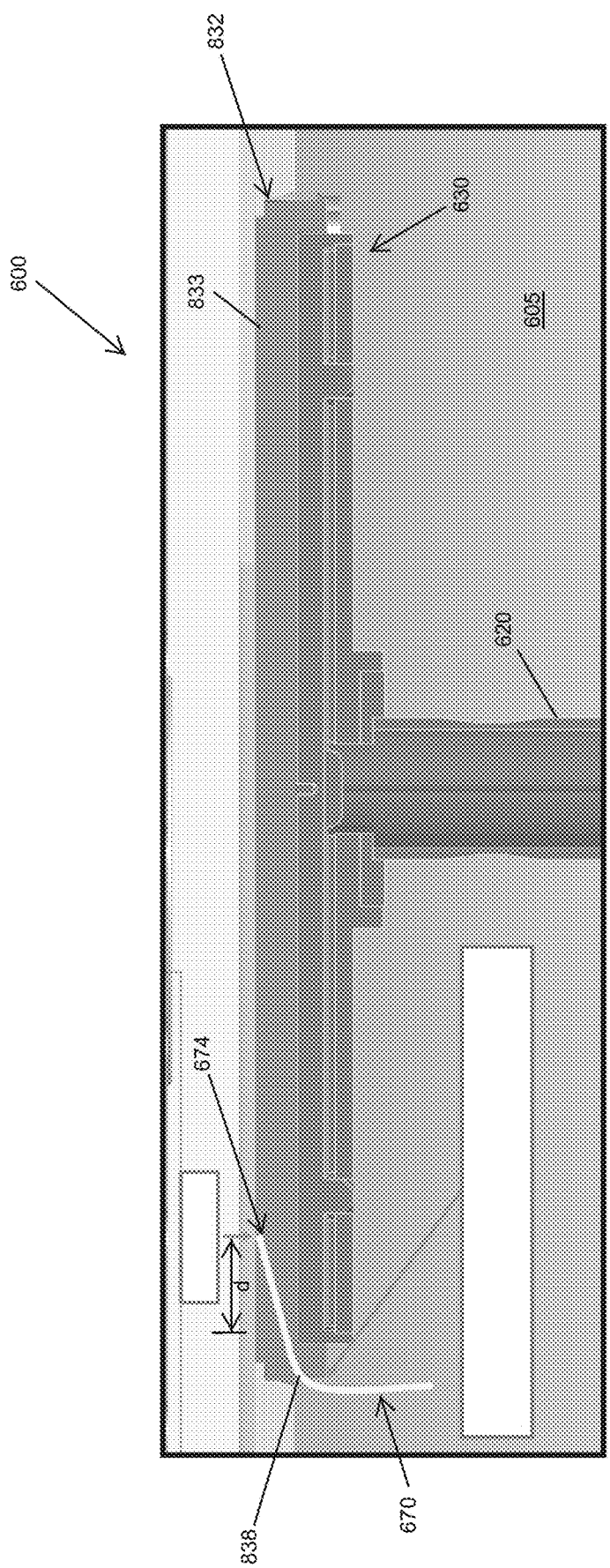
FIG. 8 is side sectional view of the reaction chamber of FIG. 6 illustrating an additional susceptor cap configuration for facilitating thermal monitoring to detect stuck lift pins.

In some embodiments, a less central sensing position may be chosen to reduce the overall length of the portion of the sensor (or cord) within the body of the cap (such as from about 6 inches down to about 3 inches or less). For example, FIG. 8 is side sectional view of the reaction chamber 600 of FIG. 6 illustrating an additional susceptor cap configuration for facilitating thermal monitoring to detect stuck lift pins, and FIG. 9 is an enlarged view of a portion of the susceptor cap 832 of FIG. 8 prior to insertion of a thermocouple 674 illustrating additional features of the modified cap 832.

As shown, the design is similar to that of FIG. 6 with several differences. The passageway 838 in the body of the cap 832 used to receive and position the thermocouple 674 is much shorter, with a radial distance (or distance from an outer edge of the cap 832), d, that may be in the range of 40 to 60 mm rather than one that is the entire radius of the cap 832 (or some amount less such as 10 to 20 mm less than the cap radius) as shown in FIG. 6. The thermocouple 674 would again be located proximate to the surface 833 of the cap 832 within the passageway 838, and it is believed that temperature measurements will be comparable to those achieved with the embodiment of FIGS. 6 and 7.

Figure 9:
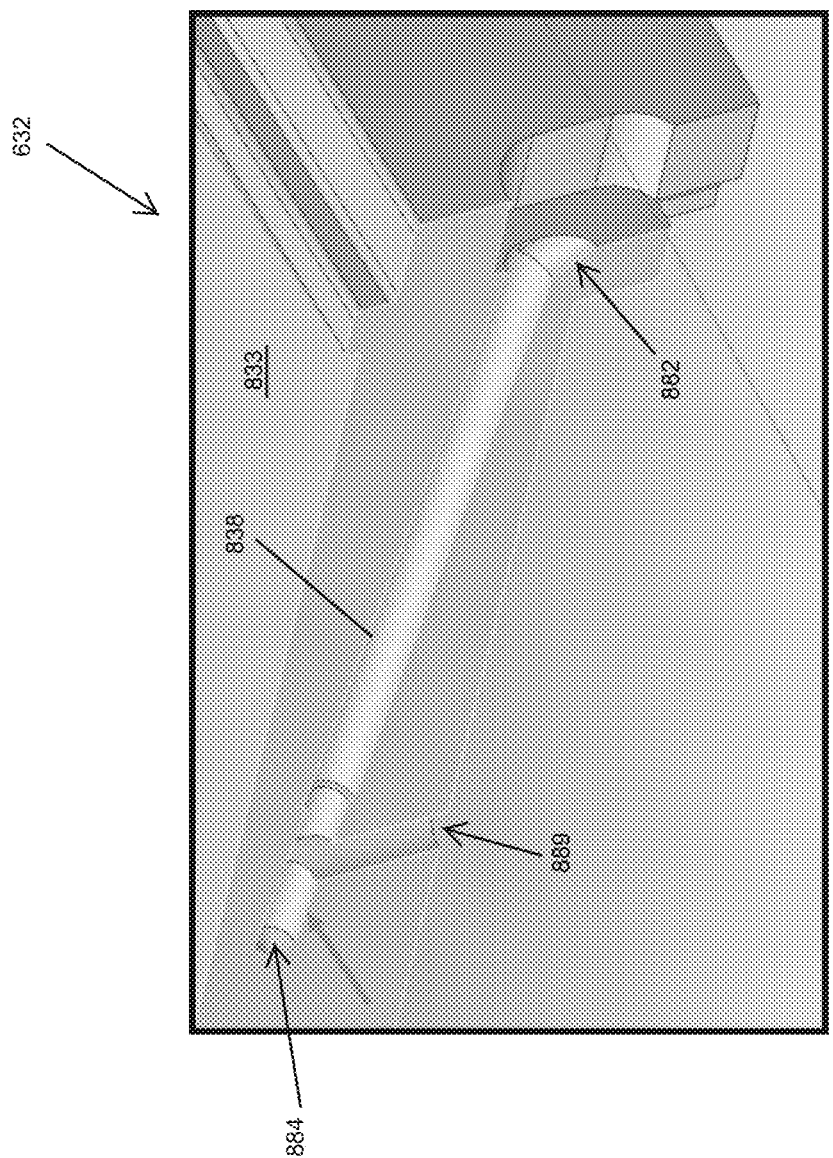
FIG. 9 is an enlarged view of a portion of the susceptor cap of FIG. 8 prior to insertion of a thermocouple illustrating additional features of the modified cap.

As seen in FIG. 9, the shortened bore/passageway 838 exits via an outlet 882 the side of the cap 832 rather than via a bottom surface of the cap 832. The cutout slots or windows shown in FIG. 7 are also eliminated as it is less likely that the sensor cord will become bent or deformed in the shorter run passageway 838. The passageway 838 ends at an interior end wall 884, against which the thermocouple/sensor element 674 would be positioned in abutting contact in its final sensing position upon assembly as shown in FIG. 8. A threaded hole 889 in the bottom surface of the body of the cap 832 is provided near this end wall 884 to allow a set screw (not shown) to be inserted to secure the sensor 670 in place within the cap 832. The bore/passageway 838 may have two diameters for receiving the sensor element/TC 674 having a smaller outer diameter near the end wall 884 and the sheathed cord having a larger outer diameter near the passageway inlet 882.

Figure 10:
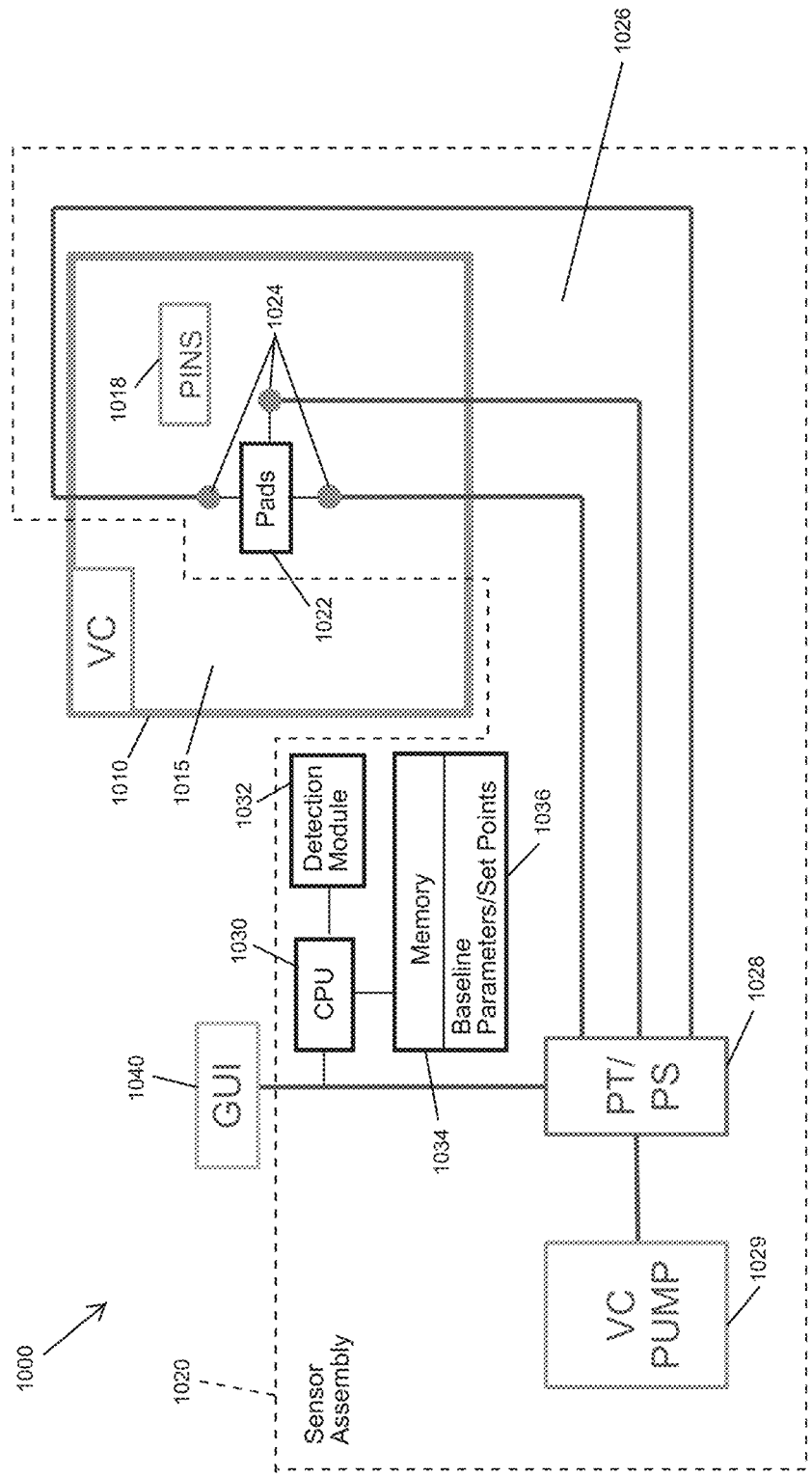
FIG. 10 illustrates a schematic diagram of a portion of a reactor system configured according to the present description to utilize pressure sensors with inlets provided or positioned in the landing pads in the reaction chamber to detect stuck lift pins.

Turning now to use of pressure monitoring to detect stuck lift pins, FIG. 10 illustrates a schematic diagram of a portion of a reactor system 1000 configured according to the present description to utilize pressure sensors with inlets provided or positioned in the landing pads in the reaction chamber to detect stuck or seized lift pins. The inventors recognized that by providing a flow of gas through pin or landing pads within a reaction chamber changes in pressure can be monitored to detect a stuck lift pin. Specifically, continuous vacuum pumping from the base of the pin pads through a central hole can be provided. Then, absolute pressure is sensed when the pins are lifted up and exhaust pressure is sensed when pin bases contact the pin pads and cover or obstruct the hole or pressure sensor inlets. A pressure drop can be monitored by individual sensors (e.g., pressure transducers, pressure sensors, or the like) for each pin when pins rest on the pin pad, and, based on this monitored pressures, alerts or warnings can be generated and communicated to operators of the system 1000.

As shown in FIG. 10, the reactor system 1000 includes a reaction or vacuum chamber 1010 with an interior space 1015 in which wafers may be processed. The chamber 1010 may generally be configured similar to the chamber 100 of FIG. 1, with landing or pin pads 1022 provided to mate with a like number of lift pins 1018 supported upon a susceptor (as shown in FIG. 4 and understood from FIGS. 1 and 2). A sensor assembly 1020 is included in the reactor system 1000 and is adapted for detecting when one of the lift pins 1018 sticks through pressure monitoring of gas flow through inlets provided in each of the pads 1022 within the interior space 1015 of the chamber 1010.

The sensor assembly 1020 includes pressure sensors 1028 fluidically linked via separate gas flow lines 1026. Gas flow lines 1026 are each coupled to one of the inlets/holes 1024 in one of the pads 1022 and run from the interior space 1015 of the chamber 1010 to an exterior space or location outside the chamber 1010. For example, each pressure sensor 1028 may take the form of a pressure transducer, a pressure switch, or other pressure sensing device in fluid communication with the lines 1026, and a vacuum pump 1029 may be provided to provide continuous vacuum pumping from the base of each pin pad 1022. In this way, the pressure sensors 1028 will generate a signal or output indicative of a pressure at or near absolute when the pins 1018 are lifted up and at or near exhaust pressure when the bases of the pins 1018 are on or contacting the pin pads 1022.

The sensor assembly 1020 includes a processor(s) 1030 that executes software, code, or instructions (that may be in memory 1034) to provide the functions of a detection module 1032, which include processing signals from the pressure sensors 1028 to detect stuck or seized pins. Further, the sensor assembly 1020 includes memory or data storage 1034 that is managed by the processor 1030 to facilitate operations of the detection module 1032. To this end, the memory 1034 may store a set of predefined baseline parameters or setpoints 1036 for the operations of the system 1000. These may include expected timing of and, in some cases, magnitudes of pressure drops in lines 1026 (each associated with one pad 1022 and one lift pin 1018).

For example, testing may be performed to determine experienced pressure drops then an elevator in the chamber 1010 moves so as to position the pins 1018 against the pads 1022, and these values may be stored as parameters/set points 1036 for use in identifying a stuck pin 1018 (e.g., pressure drop not seen when expected or at a delayed time) are resting upon or contacting the pads 1022 (and covering or obstructing inlets 1024 to the lines 1026 (that may take the form of a weep hole in the pads 1022). The parameters 344 may also include timing of elevator movements to allow the detection module 332 to match elevator movements (and corresponding susceptor positions) with measured temperatures of the pads 318.

The module 1032 may cause pressures that are sensed by the sensors 1028 to be displayed such as on a GUI 1040 on a user's monitoring device. In other cases, the module 1032 may process the signals from the sensors 1028 along with the baseline parameters/set points 1036 to determine that an expected pressure variance (a rise or drop in pressures in lines 1026) is not seen or is delayed for one (or more) of the pads 1022 and, in response, may generate an alert or warning of a potentially stuck pin 1018. This alert may be communicated to an operator or use of system 1000 such as via the GUI 1040 on a monitor/display device. In some cases, the outputs (sensed pressures) from the thermocouples 322, 324, and 326 are displayed, too, on the GUI 1040 to provide real-time (or near real-time) monitoring of sensed pressures and/or pressure variations between the pads 1022 (or lines 1026) (e.g., sensed pressures when pins 1018 are expected via elevator movements to be resting on the pads 1022).

Figure 11:
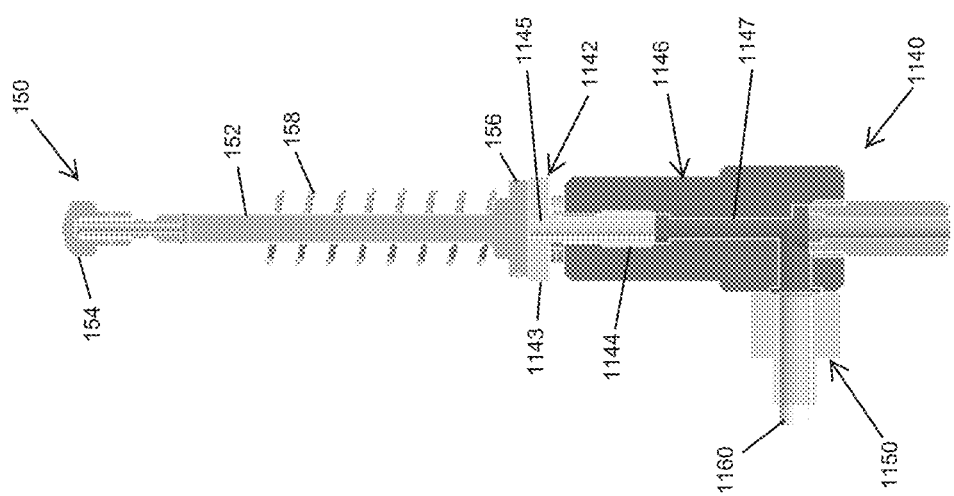
FIG. 11 is a side sectional view of a pin pad assembly of the present description, such as for use in the sensor assembly of FIG. 10, along with a lift pin in the down position.

FIG. 11 is a side sectional view of a pin pad assembly 1140 configured according to the present description, such as for use as a pad 1022 in the sensor assembly 1020 of FIG. 10, along with a lift pin 150 in the down position. To achieve pressure monitoring, the lift pin 150 does not require modification, and its components may be those described with reference to FIG. 2 including body 152 and base 156 (with a lower planar surface) at a lower end or portion of the body 152.

For pressure monitoring, a new pin or landing pad assembly 1140 is provided for each lift pin 150. As shown, the assembly 1140 includes a pin pad 1142 with an elongated body 1144 and a head 1143 extending from an upper end of the body 1144 to receive the base 156 of the pin 150 during operations of a reactor system. The pin pad 1142 is configured to provide a flow path for gas from the reaction chamber (e.g., interior space 1015 of chamber 1010 in FIG. 10) to a gas flow line 1160, which will extend outside the chamber. To this end, the head 1143 includes a weep or thru hole 1145 that acts as an inlet for gas to flow to a pressure sensor and extends from an upper surface of the head 1143 through the body 1144.

The landing pad 1142 is supported upon a base 1146 (which is, in turn, supported upon a lower component of the reaction chamber). The base 1146 includes a passageway 1147 defining a gas flow path through the base 1146, and, when the landing pad 1142 is connected with the base 1146, the inlet or thru hole 1145 is fluidically coupled with the passageway 1147 so that gas can flow through the assembly 1140. A coupling or seal member 1150 (e.g., a C-seal or the like) is provided, as shown, to couple the gas flow line 1160 to the base 1146 such that the passageway 1147 is coupled with the tube/line 1160 (or its inlet).

As discussed with reference to FIG. 10, a pump can be coupled to line 1160 to draw gas from the space about the assembly 1140 through the inlet 1145 and passageway 1147, and pressure in the line 1160 can be monitored to determine if the pin 150 is sticking (not properly moving up and down through a susceptor). Gas flow is blocked or at least obstructed when the pin 150 is in the down position (shown in FIG. 11) with the pin base 156 abutting the head 1143 of the landing or pin pad 1142 (e.g., with the pin 150 covering or obstructing the weep or thru hole/inlet 1145). When the pin 150 is later lifted (by operations of the elevator moving the susceptor), flow through the inlet 1145 is again unobstructed.

Figure 12:
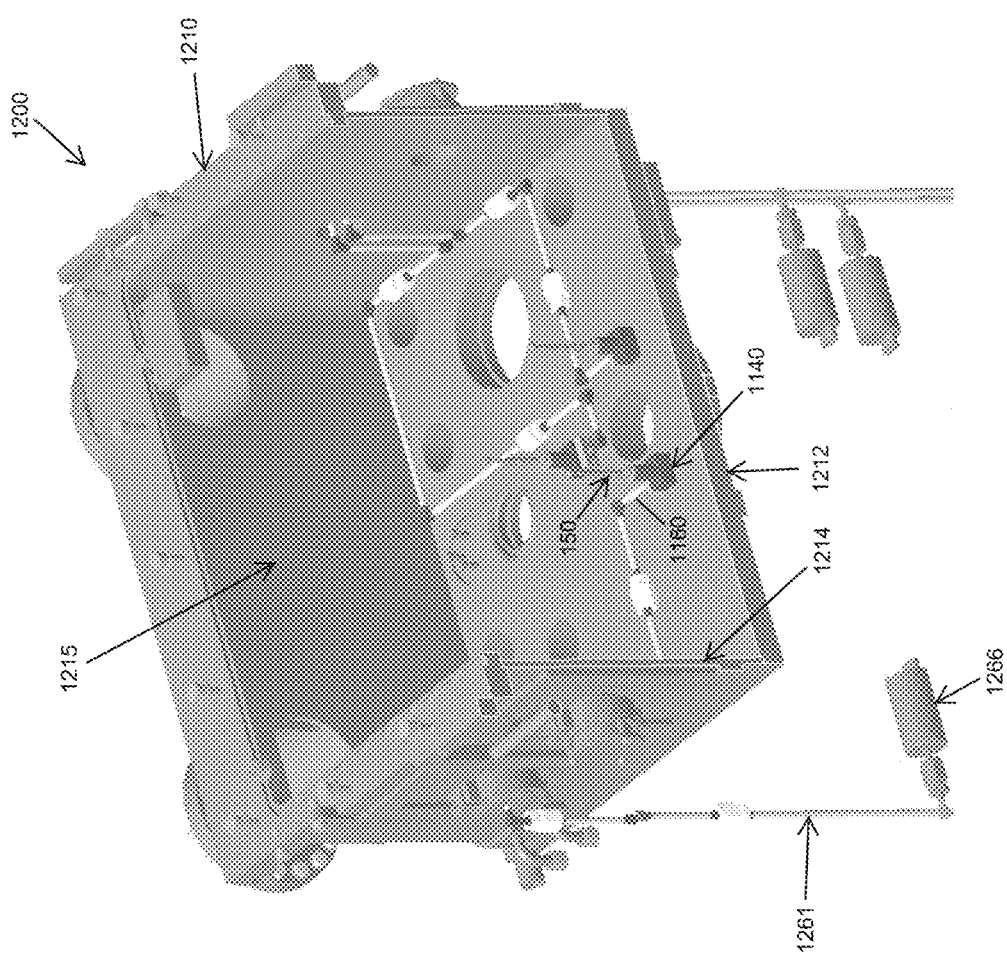
FIG. 12 is a top perspective view of a portion of a reactor system showing an interior space of a reaction chamber including three of the pin pad assemblies of FIG. 11 each paired with a lift pin.

FIG. 12 is a top perspective view of a portion of a reactor system 1200 showing an interior space 1215 of a reaction chamber 1210 including three of the pin pad assemblies of FIG. 11 each paired with a lift pin. As a specific example, pin pad assembly 1140 is shown to be paired with and receiving lift pin 150 (which is shown in the down position). The pin pad assembly 1140 is mounted to a lower wall 1212 of the chamber 1210 and is arranged to receive the lift pin 150 during its vertical travel (e.g., through and with a susceptor (not shown in FIG. 12 but understood from FIGS. 1 and 4) during elevator movements).

The interior space 1215 of the chamber 1210 is further defined by sidewall 1214, and each pad assembly 1140 is provided with individual and separate gas line routing to sense pressures of gases flowing through each assembly 1140 during operations of the system 1200. As shown, the gas flow line 1160 is coupled to the landing pad assembly 1140 and extends along the upper surface of the bottom wall 1212 to the sidewall 1214. At this point, it passes through the sidewall 1214 and is coupled to an exterior section 1261. A pressure sensor 1266 is in fluid communication with the exterior section 1261 of the flow line 1160, and it operates to sense pressures in the line, which will vary depending upon the location of the lift pin 150 relative to the pad of assembly 1140 (e.g., pad 1142 in FIG. 11). In this manner, pressures at each pad assembly 1140 (with three shown to correspond with three lift pins) can be sensed and compared with each other or with expected baselines to determine whether one or more of the lift pins 150 may be sticking or seizing (e.g., causing a change in the amount or timing of a pressure variance as determined by a detection module to be indicative of a stuck pin 150).

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A reactor system with stuck lift pin detection, comprising:
    a reaction chamber;
    a susceptor for supporting wafers in an interior space of the reaction chamber;
    an elevator coupled to the susceptor and configured to raise and lower the susceptor in the interior space;
    a lift pin supported by and extending vertically through the susceptor to travel between an up and a down position with movements of the susceptor by the elevator;
    a landing pad for receiving a base of the lift pin when the lift pin is in the down position; and
    a sensor assembly with a sensor positioned at least partially within the interior space of the reaction chamber, wherein an output signal of the sensor is indicative of whether the lift pin is sticking or seizing during travel through the susceptor.

2. The reactor system of claim 1, wherein the sensor assembly further includes a detection module displaying data based on the output signal of the sensor or processing the output signal of the sensor to detect when the lift pin is sticking or seizing during the travel through the susceptor.

3. The reactor system of claim 2, wherein the output signal provides a sensed temperature or pressure and wherein the processing of the output signal by the detection module includes comparing the sensed temperature or pressure with predefined temperature or pressure disturbances associated with travel of the lift pin free of sticking or seizing or includes comparing timing of the sensed temperature or pressure with reference to movements of the elevator.

4. The reactor system of claim 1, further comprising a cap covering an upper surface of the susceptor and wherein the sensor includes a temperature sensor positioned within a passageway provided in a body of the cap, whereby the output signal is associated with a sensed temperature of the cap.

5. The reactor system of claim 4, wherein the temperature sensor comprises a thermocouple or a resistance temperature detector positioned proximate to a center axis of the cap.

6. The reactor system of claim 5, wherein the temperature sensor includes a line for carrying the output signal extending away from the thermocouple or the resistance temperature detector and wherein the line includes two or more coils in the interior space of the reaction chamber.

7. The reactor system of claim 4, wherein the temperature sensor comprises a thermocouple or a resistance temperature detector positioned a radial distance from an edge of the cap that is in the range of 40 to 60 millimeters.

8. The reactor system of claim 1, wherein the sensor comprises a temperature sensor positioned within the landing pad, whereby the output signal is associated with a sensed temperature of the landing pad.

9. The reactor system of claim 8, wherein the temperature sensor comprises a thermocouple or a resistance temperature detector positioned in a head of the landing pad adapted for receiving the base of the lift pin.

10. The reactor system of claim 1, wherein the sensor comprises a gas inlet in the landing pad, a pressure sensor disposed exterior to the reaction chamber, and a flow line fluidically coupling the landing pad to the pressure sensor, whereby the output signal is associated with a sensed pressure in the flow line.

11. The reactor system of claim 10, wherein the gas inlet comprise a hole in a head of the landing pad, wherein the base of the lift pin covers or obstructs flow of gas through the hole when the lift pin is in the down position, and wherein the sensor assembly further comprises a gas pump coupled to the flow line operable to draw gas from the interior space of the reaction chamber through the landing pad and the flow line.

12. A reactor system with stuck lift pin detection, comprising:
    a reaction chamber;
    a susceptor with a cap for supporting wafers in an interior space of the reaction chamber;
    an elevator for raising and lowering the susceptor in the interior space;
    a lift pin supported by and extending vertically through the susceptor to travel between an up and a down position with movements of the susceptor by the elevator;
    a landing pad for receiving a base of the lift pin when the lift pin is in the down position; and
    a sensor assembly including a temperature sensor positioned within a passageway provided in the cap, wherein an output signal of the temperature sensor provides a sensed temperature of the cap.

13. The reactor system of claim 12, wherein the sensor assembly further includes a detection module displaying temperature data for the cap based on the sensed temperature or processing the sensed temperature to detect when the lift pin is sticking or seizing during the travel through the susceptor.

14. The reactor system of claim 13, wherein the processing of the output signal by the detection module includes comparing the sensed temperature with predefined temperature disturbances associated with travel of the lift pin free of sticking or seizing or includes comparing timing of the sensed temperature with reference to movements of the elevator.

15. The reactor system of claim 12, wherein the temperature sensor comprises a thermocouple or a resistance temperature detector positioned proximate to a center axis of the cap.

16. The reactor system of claim 12, wherein the temperature sensor includes a line for carrying the output signal extending away from temperature sensor and wherein the line includes two or more coils in the interior space of the reaction chamber.

17. The reactor system of claim 12, wherein the temperature sensor is positioned within a passageway provided in a body of the cap, wherein the temperature sensor comprises a thermocouple or a resistance temperature detector positioned in the passageway at a radial distance from an edge of the cap that is in the range of 40 to 60 millimeters.

18. A method for monitoring lift pin travel in a reaction chamber, comprising:

with a temperature sensor, sensing a temperature of a susceptor cap at an operational state of the reaction chamber;

comparing the temperature of the susceptor cap with a predefined range of expected temperatures for the operational state of the reaction chamber; and when the comparing determines the temperature of the susceptor cap is outside the predefined range of expected temperatures, generating an alert message or updating a graphical user interface (GUI) indicating a stuck lift pin condition.

19. The method of claim 18, wherein the operational state of the reaction chamber is associated with dropping a wafer upon an upper surface of the susceptor cap.

20. The method of claim 18, wherein the temperature sensor comprises a thermocouple or a resistance temperature detector positioned within the susceptor cap.

\* \* \* \* \*